(12) United States Patent
Xu

(10) Patent No.: US 8,451,967 B2
(45) Date of Patent: May 28, 2013

(54) METHOD AND APPARATUS FOR CLOCK CHECKING

(75) Inventor: Jichao Xu, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 0 days.

(21) Appl. No.: 13/377,062

(22) PCT Filed: May 26, 2010

(86) PCT No.: PCT/CN2010/073272
§ 371 (c)(1),
(2), (4) Date: Dec. 8, 2011

(87) PCT Pub. No.: WO2010/142204
PCT Pub. Date: Dec. 16, 2010

(65) Prior Publication Data
US 2012/0082281 A1    Apr. 5, 2012

(30) Foreign Application Priority Data
Jun. 10, 2009   (CN) .......................... 2009 1 0087149

(51) Int. Cl.
*H04L 7/00* (2006.01)
(52) U.S. Cl.
USPC ............ 375/354; 375/360; 327/141; 327/160
(58) Field of Classification Search
USPC .......... 375/354, 360, 371, 375, 377; 327/141, 327/144, 151, 160, 162
See application file for complete search history.

(56) References Cited

U.S. PATENT DOCUMENTS

| 7,724,812 | B2 * | 5/2010 | Xia ............................... 375/226 |
| 8,170,165 | B2 * | 5/2012 | Arviv et al. .................... 375/354 |
| 2002/0008548 | A1 | 1/2002 | Kimura |
| 2007/0262824 | A1 | 11/2007 | Yamasaki |
| 2010/0166131 | A1 * | 7/2010 | Li et al. ......................... 375/371 |
| 2012/0082281 | A1 | 4/2012 | Xu |

FOREIGN PATENT DOCUMENTS

| CN | 101063895 | 10/2007 |
| CN | 101582732 | 11/2009 |
| JP | 7-234742 | 9/1995 |
| JP | 11-355110 | 12/1999 |
| JP | 2003-308131 | 10/2003 |

* cited by examiner

*Primary Examiner* — Dac Ha
(74) *Attorney, Agent, or Firm* — Marshall, Gerstein & Borun LLP; Randall G. Rueth

(57) ABSTRACT

Disclosed is a method and apparatus for clock checking, to solve the problem of high resource occupation in existing clock checking methods. The method includes: a programmable device for performing frequency division on the source clock signal to obtain a reference clock signal; treating the source clock signal as a counting work clock to determine the counting value of rising edges and counting value of high levels of a clock signal being checked during each high level period out of N continuous high levels of the reference clock signal; and determining whether the clock signal being checked is valid according to the magnitude relationship between the counting value of the high levels of the clock signal being checked during each high level period and a first expected value, as well as the magnitude relationship between the counting value of the rising edges and a second expected value.

14 Claims, 4 Drawing Sheets

METHOD AND APPARATUS FOR CLOCK CHECKING

CROSS-REFERENCE TO RELATED APPLICATIONS

This is a national phase of International Patent Application No. PCT/CN2010/073272 filed May 26, 2010, which in turn claims the priority benefit of Chinese Patent Application No. 200910087149.7 filed Jun. 10, 2009, the entire respective disclosures of which are incorporated herein by reference.

FIELD OF THE INVENTION

The present invention relates to the field of communication technology, and in particular to a method and apparatus for clock checking.

BACKGROUND OF THE INVENTION

With the rapid development of digital synchronous network, the requirement to reliability and security of clocks in a communication apparatus has become higher and higher.

The so-called network synchronization means that the clock frequencies and phases of all switching nodes in the network are controlled in a predetermined range of tolerance, so that all the digital streams of each switching node within the network are correctly and effectively switched, otherwise, overflow and underflow of information bits may be generated in a digital switch, sliding damage of digital streams and errors of data may be caused. Since the sliding due to non-synchronous clock frequencies may occur in all the systems which use a same clock, it has great influence and must be controlled effectively.

In the communication apparatus, hot backup protection is usually employed for a clock unit, and there are a plurality of clock reference sources for the clock unit, so as to ensure that the switching of the clock sources and of the clock units can be triggered in time when a clock operates abnormally, and therefore it is especially important to check the validity of clocks. However, in the existing methods for clock validity checking, some checking circuits may use some separated apparatuses on periphery, which will take much space (comprising layout space and wiring space) of a printed circuit board (PCB) and occupy large resources.

SUMMARY OF THE INVENTION

The embodiments of the present invention provide a method and an apparatus for clock checking, so as to solve the problem of high resource occupation in existing clock checking methods.

The embodiment of the present invention provides a method for clock checking, comprising:

a programmable device performing frequency division on a source clock signal generated by a local timing source, to obtain a reference clock signal;

the programmable device treating the source clock signal as a counting work clock, to determine the counting value of rising edges and counting value of high levels of a clock signal being checked, during each high level period out of N continuous high levels of the reference clock signal, wherein the N is a positive integer; and the programmable device determining whether the clock signal being checked is valid according to the magnitude relationship between the counting value of the high levels of the clock signal being checked during the each high level period and a first expected value, as well as the magnitude relationship between the counting value of the rising edges and a second expected value.

The step of the programmable device determining whether the clock signal being checked is valid according to the magnitude relationship between the counting value of the high levels of the clock signal being checked during the each high level period and a first expected value, as well as the magnitude relationship between the counting value of the rising edges of the clock signal being checked during the each high level period and a second expected value comprises:

the programmable device determining whether the counting value of the high levels of the clock signal being checked during the each high level period exceeds the first expected value and whether the counting value of the rising edges of the clock signal being checked during the each high level period exceeds the second expected value; and the programmable device determining that the clock signal being checked is valid when the programmable device determines that the counting value of the high levels of the clock signal being checked during the each high level period does not exceed the first expected value and the counting value of the rising edges does not exceed the second expected value; and the programmable device determining that the clock signal being checked is invalid when the programmable apparatus determines that the counting value of the high levels of the clock signal being checked during the each high level period exceeds the first expected value and the counting value of the rising edges exceeds the second expected value.

The step of the programmable apparatus determining whether the counting value of the high levels of the clock signal being checked during the each high level period exceeds the first expected value and whether the counting value of the rising edges exceeds the second expected value comprises:

the programmable device latching, at a falling edge of the each high level, the counting value of the high levels and the counting value of the rising edges of the clock signal being checked during a current high level period, then clearing the counting value of the high levels and the counting value of the rising edges of the clock signal being checked during the current high level period, and determining, during clearing the high level, whether the counting value of the high levels of the clock signal being checked during the current high level period exceeds the first expected value and whether the counting value of the rising edges of the clock signal being checked during the current high level period exceeds the second expected value.

Moreover, the programmable device can also determine duty ratio of the clock signal being checked as: dividing the counting value of the high levels of the clock signal being checked during any high level period out of the N continuous high levels by ½ of the ratio of a frequency of the source clock signal to a frequency of the reference clock signal.

The embodiment of the present invention provides an apparatus for clock checking, comprising:

a local timing source configured to generate a source clock signal; and a programmable device configured to perform frequency division on the source clock signal to obtain a reference clock signal, to treat the source clock signal as a counting work clock so as to determine a counting value of rising edges and a counting value of high levels of a clock signal being checked during each high level period out of N continuous high levels of the reference clock signal, wherein the N is a positive integer, and to determine whether the clock signal being checked is valid according to a magnitude relationship between the counting value of the high levels of the clock signal being checked during the each high level period and a first expected value as well as a magnitude relationship between the counting value of the rising edges of the clock signal being checked during the each high level period and a second expected value.

The programmable device comprises:

a frequency divider configured to perform frequency division on the source clock signal to obtain the reference clock signal;

a counter configured to treat the source clock signal as the counting work clock, to obtain the counting value of the rising edges by counting rising edges of the clock signal being checked during the each high level period of the reference clock signal, and to obtain the counting value of the high levels by sampling and counting high levels of the clock signal being checked during the each high level period; and a determiner configured to determine whether the clock signal being checked is valid according to the magnitude relationship between the counting value of the high levels of the clock signal being checked during the each high level period and the first expected value as well as the magnitude relationship between the counting value of the rising edges and the second expected value.

The determiner further comprises:

a judging module configured to determine whether the counting value of the high levels of the clock signal being checked during the each high level period exceeds the first expected value, and whether the counting value of the rising edges exceeds the second expected value; and a determining module configured to determine the clock signal being checked as valid when the counting value of the high levels of the clock signal being checked during the each high level period does not exceed the first expected value and the counting value of the rising edges of the clock signal being checked during the each high level period does not exceed the second expected value; and to determine the clock signal being checked as invalid when the counting value of the high levels of the clock signal being checked during the each high level period exceeds the first expected value and the counting value of the rising edges of the clock signal being checked during the each high level period exceeds the second expected value.

The judging module is configured to latch, at a falling edge of the each high level, the counting value of the high levels and the counting value of the rising edges of the clock signal being checked during a current high level period, then to clear the counting value of the high levels and the counting value of the rising edges of the clock signal being checked during the current high level period, and to determine, during clearing the high level, whether the counting value of the high levels of the clock signal being checked during the current high level period exceeds the first expected value and whether the counting value of the rising edges of the clock signal being checked during the current high level period exceeds the second expected value.

The apparatus for clock checking also comprises:

a duty ratio determining module configured to determine duty ratio of the clock signal being checked as: dividing the counting value of the high levels of the clock signal being checked during any high level period out of the N continuous high levels by ½ of ratio of a frequency of the source clock signal to a frequency of the reference clock signal.

The technical solution in the embodiments of the present invention employs the programmable device to check clocks, which occupies few resources and improves the reliability of the clock checking; moreover, the frequency range of the clock signal being checked is relatively wide, and some influences caused by high-frequent glitches of the clock signal being checked can be filtered by using the source clock signal as the counting work clock.

Furthermore, the technical solution in the embodiments of the present invention can also determine the duty ratio of the clock signal being checked, which can not be realized by existing clock checking methods.

BRIEF DESCRIPTION OF THE ACCOMPANYING DRAWINGS

DETAILED DESCRIPTION OF THE EMBODIMENTS

To solve problems in existing art, the embodiments of the present invention provide a method and apparatus for clock checking. The technical solution of embodiments of the present invention employs a programmable device to check clocks, which occupies fewer resources and improves the reliability of clock checking; and moreover, the frequency range of the clock signals being checked is relatively wide, and some influences caused by high-frequent glitches of the clock signals being checked can be filtered by using a source clock signal as a counting work clock.

Figure 1:
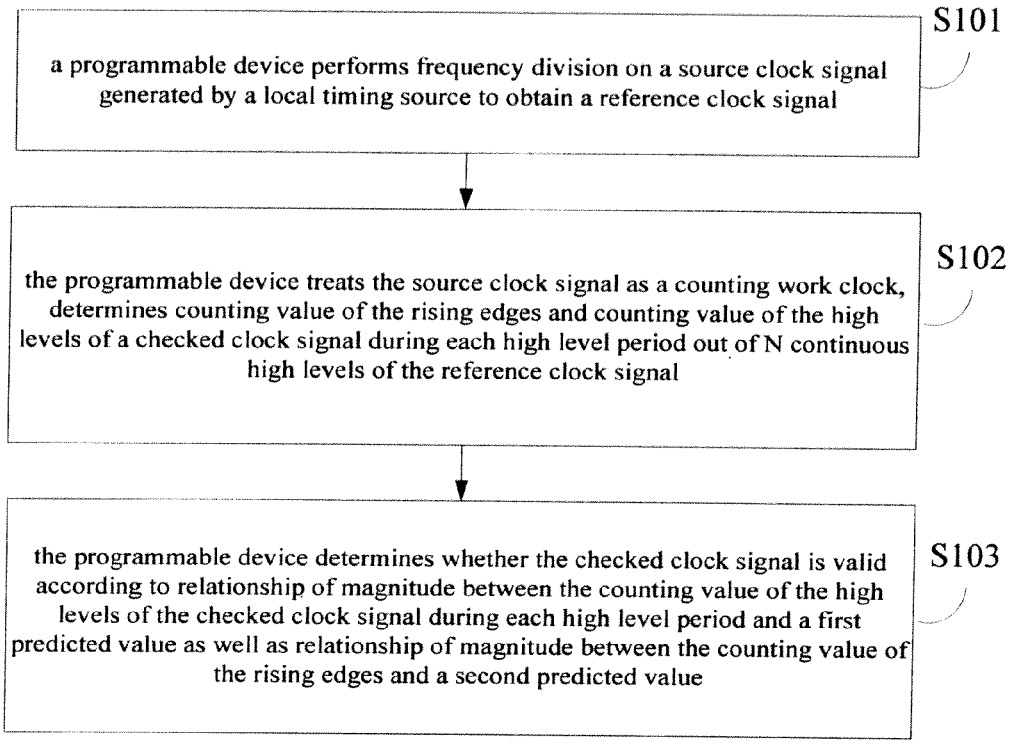
FIG. 1 is a flowchart of a method for clock checking in the embodiments of the present invention.

As shown in FIG. 1, the method for clock checking provided by the embodiments of the present invention comprises the following steps S101 to S103.

S101: A programmable device performs frequency division on a source clock signal generated by a local timing source so as to obtain a reference clock signal, wherein the above local timing source is a clock source for generating the source clock signal, for example, a local crystal oscillator, etc.

S102: The programmable device treats the source clock signal as a counting work clock, and determines a counting value of rising edges and a counting value of high levels of a clock signal being checked during each high level period out of N continuous high levels of the reference clock signal, where N is a positive integer, i.e., N is an integer larger than 1.

S103: The programmable device determines whether the clock signal being checked is valid according to a magnitude relationship between the counting value of the high levels of the clock signal being checked during each high level period and a first expected value as well as a magnitude relationship between the counting value of the rising edges of the clock signal being checked during each high level period and a second expected value.

The above method for clock checking uses the programmable device to check clocks, which occupies fewer resources and improves the reliability of the clock checking; and moreover, the frequency range of the clock signals being checked is relatively wide, and some influences caused by high-frequent glitches of the clock signals being checked can be filtered by using the source clock signal as the counting work clock. It should be noted that in the above method for clock checking, the more the referred counting results of the reference clock signal during the high level periods are, the more accurate the clock checking is. For example, the clock checking based on the counting results during 5 continuous high level periods of the reference clock signal is more accurate than the clock checking based on the counting results during 3 continuous high level periods of the reference clock signal.

Figure 2:
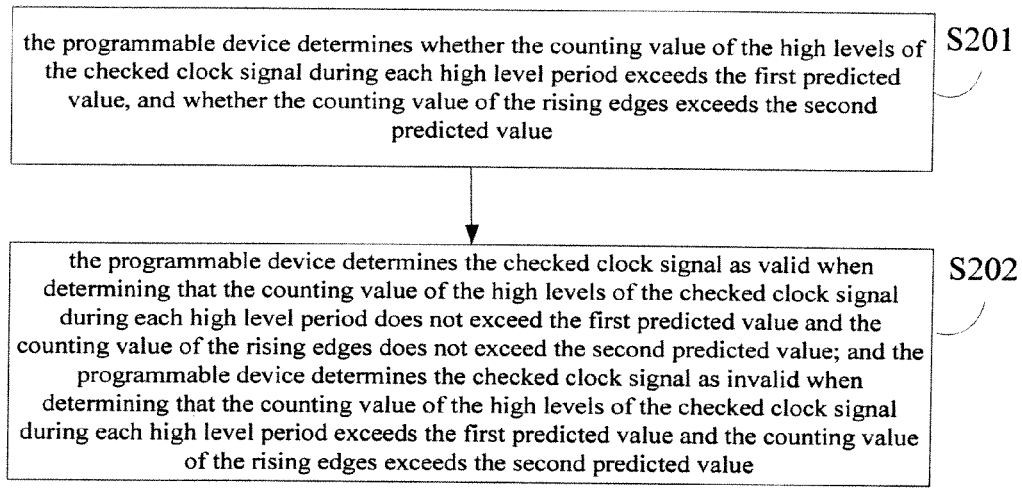
FIG. 2 is a detailed flowchart of step S103 in the embodiments of the present invention.

As shown in FIG. 2, step S103 further comprises the following steps S201 to S202.

S201: The programmable device determines whether the counting value of the high levels of the clock signal being checked during each high level period exceeds the first expected value, and whether the counting value of the rising edges exceeds the second expected value.

Specifically, the programmable device latches, at the falling edge of each high level, the counting value of the high levels and counting value of the rising edges of the clock signal being checked during current high level period, then clears the counting value of the high levels and the counting value of the rising edges during the current high level period, and determines, during clearing the high level, whether the counting value of the high levels of the clock signal being checked during the current high level period exceeds the first expected value and whether the counting value of the rising edges exceeds the second expected value. By this procedure, two kinds of counting values are latched at the falling edge of each high level, thereby ensuring the integrity and accuracy of measurement; and moreover, the determination procedure is carried out during clearing the high level, and therefore, the next counting procedure is not affected.

S202: The programmable device determines the clock signal being checked as valid when determining that the counting value of the high levels of the checked lock signal during each high level period does not exceed the first expected value and the counting value of the rising edges does not exceed the second expected value; and the programmable device determines the clock signal being checked as invalid when determining that the counting value of the high levels of the clock signal being checked during each high level period exceeds the first expected value and the counting value of the rising edges of the clock signal being checked during each high level period exceeds the second expected value.

In the above method for clock checking, the validity of the clock signal being checked is determined according to the counting results during a number of high level periods, so that the accuracy of measurement is improved.

Moreover, the programmable device may also determine the duty ratio of the clock signal being checked as: dividing the counting value of the high levels of the clock signal being checked during any high level period out of the above N continuous high levels by ½ of the ratio of the frequency of the source clock signal to the frequency of the reference clock signal. By this procedure, the duty ratio of the clock signal being checked can be determined, which can not be realized by existing methods for clock checking.

Figure 3:
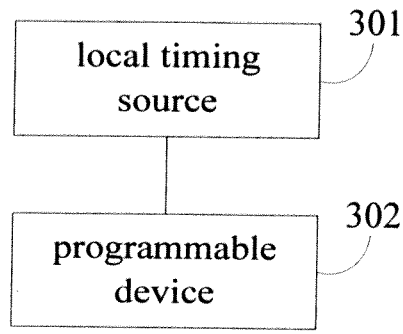
FIG. 3 is a schematic structural diagram of an apparatus for clock checking in the embodiments of the present invention.

As shown in FIG. 3, the embodiments of the present invention also provide an apparatus for clock checking, comprising:

a local timing source 301 configured to generate a source clock signal; and a programmable device 302 configured to perform frequency division on the source clock signal to obtain a reference clock signal, to treat the source clock signal as a counting work clock, to determine a counting value of rising edges and a counting value of high levels of a clock signal being checked during each high level period out of N continuous high levels of the reference clock signal, where N is a positive integer, and to determine whether the clock signal being checked is valid according to a magnitude relationship between the counting value of the high levels of the clock signal being checked during each high level period and a first expected value as well as a magnitude relationship between the counting value of the rising edges of the clock signal being checked during each high level period and a second expected value.

The above apparatus for clock checking uses the programmable device to check clocks, which occupies fewer resources and improves the reliability of clock checking; and moreover, the frequency range of the clock signals being checked is relatively wide, and some influences caused by high-frequent glitches of the clock signal being checked can be filtered by using the source clock signal as the counting work clock. It should be noted that in the above apparatus for clock checking, the more the referred counting results of the reference clock signal during the high level periods are, the more accurate the clock checking is. For example, the clock checking based on the counting results during 5 continuous high level periods of the reference clock signal is more accurate than the clock checking based on the counting results during 3 continuous high level periods of the reference clock signal.

Figure 4:
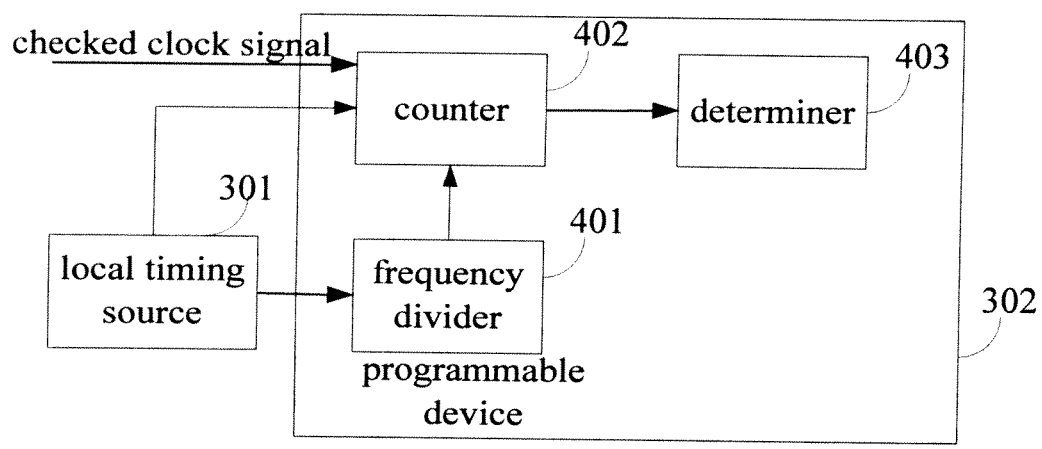
FIG. 4 is a schematic structural diagram of another apparatus for clock checking in the embodiments of the present invention.

In this case, as shown in FIG. 4, the programmable device 302 comprises:

a frequency divider 401 configured to perform frequency division on the source clock signal to obtain the reference clock signal;

a counter 402 configured to treat the source clock signal as the counting work clock, to obtain the above counting value of the rising edges by counting rising edges of the clock signal being checked during each high level period out of the N continuous high levels of the reference clock signal, and to obtain the counting value of the high levels of the clock signal being checked by sampling and counting its high levels during the above each high level period; and a determiner 403 configured to determine whether the clock signal being checked is valid according to the magnitude relationship between the counting value of the high levels of the clock signal being checked during each high level period and the first expected value as well as the magnitude relationship between the counting value of the rising edges and the second expected value.

Figure 5:
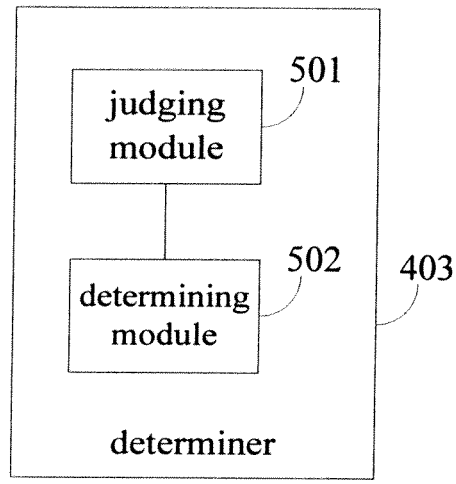
FIG. 5 is a schematic structural diagram of the determiner 403 in the embodiments of the present invention.

In the above, as shown in FIG. 5, the determiner 403 further comprises:

a judging module 501 configured to determine whether the counting value of the high levels of the clock signal being checked during each high level period out of the N continuous high levels exceeds the first expected value, and whether the counting value of the rising edges exceeds the second expected value; and a determining module 502 configured to determine the clock signal being checked being as valid when the counting value of the high levels of the clock signal being checked during above each high level period does not exceed the first expected value and the counting value of the rising edges does not exceed the second expected value; and to determine the clock signal being checked as invalid when the counting value of the high levels of the clock signal being checked during each high level period exceeds the first expected value and the counting value of the rising edges exceeds the second expected value.

In the above, the judging module 501 is also configured to latch, at the falling edge of above each high level, the counting value of the high levels and the counting value of the rising edges of the clock signal being checked during a current high level period, then to clear the counting value of the high levels and the counting value of the rising edges during the current high level period, and to determine, during clearing the high level, whether the counting value of the high levels of the clock signal being checked during the current high level period exceeds the first expected value and whether the counting value of the rising edges of the clock signal being checked during the current high level period exceeds the second expected value.

Figure 6:
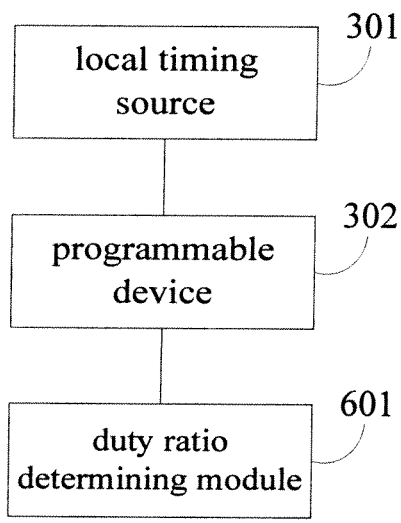
FIG. 6 is a schematic structural diagram of the apparatus for clock checking comprising a duty ratio determining module in the embodiments of the present invention.

As shown in FIG. 6, the apparatus shown in FIG. 3 (or comprising the apparatus for clock checking in FIG. 4 or the apparatus for clock checking comprising the determiner 403 shown in FIG. 5) further comprises:

a duty ratio determining module 601 configured to determine duty ratio of the clock signal being checked as: dividing the counting value of the high levels of the clock signal being checked during any high level period out of above N continuous high levels by ½ of ratio of the frequency of the source clock signal to the frequency of the reference clock signal.

The apparatus for clock checking shown in FIG. 6 may also determines the duty ratio of the clock signal being checked, which can not be realized by existing apparatus for clock checking.

The technical solution in the embodiments of the present invention will be described hereinafter by an example in combination with the apparatus for clock checking shown in FIG. 4.

Figure 7:
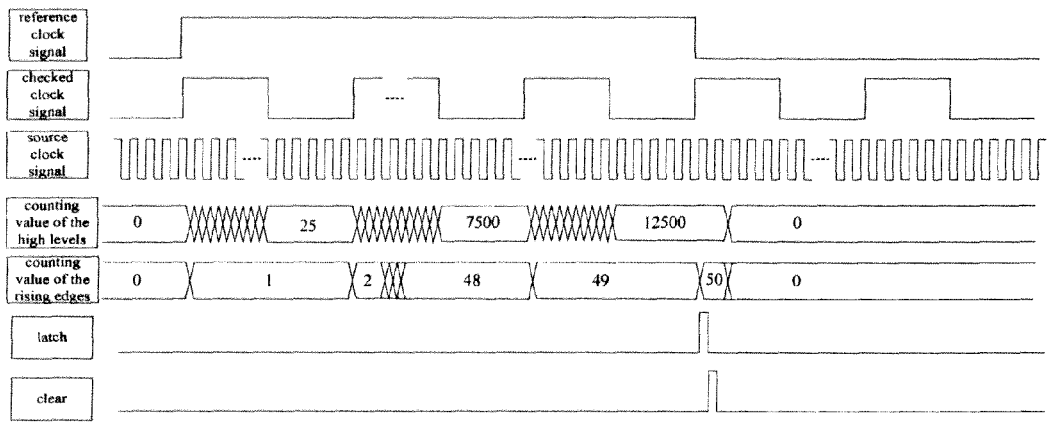
FIG. 7 is a sequence diagram of a counter in the embodiments of the present invention.
Figure 8:
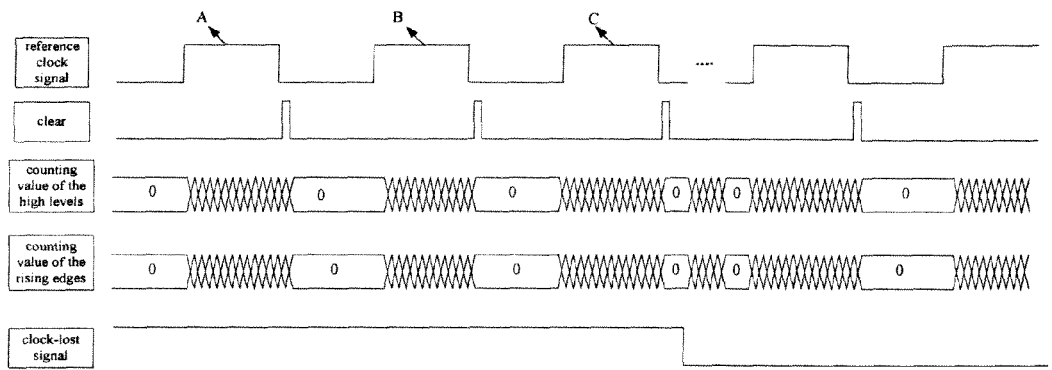
FIG. 8 is a sequence diagram of another counter in the embodiments of the present invention.

As shown in FIGS. 7 and 8, it is assumed that the frequency of the source clock signal generated by the local timing source is 50 MHz, duty ratio thereof is 50%, and the source clock signal is input into the frequency divider 401; the frequency of the clock signal being checked is 100 KHz, and the clock signal being checked is input into the frequency divider 401; and the clock checking is performed by using the technical solution in the embodiments of the present invention by the following method.

The frequency divider 401 performs frequency division on the source clock signal to obtain the reference clock signal, the frequency of which is 1 KHz.

The counter 402 counts the rising edges of the clock signal being checked during 3 continuous high level periods A, B and C of the reference clock signal respectively (as shown in FIG. 8) so as to obtain the respective counting values of the rising edges of the clock signal being checked during the high level periods A, B and C, inputs the above counting value of the rising edges into the determiner 403, treats the source clock signal as the counting work clock, and samples and counts high level values of the clock signal being checked during the high level periods A, B and C to obtain the counting value of the high levels of the clock signal being checked during the high level periods A, B and C (for example, the counting value of the high levels of the clock signal being checked during the high level period A is 12500), and inputs the counting value of the high levels into the determiner 403.

The determiner 403 latches, at the falling edge of high level periods A, B and C, the counting value of the high levels and the counting value of the rising edges during current high level period, respectively, then clears the counting value of the high levels and the counting value of the rising edges of the clock signal being checked during the current high level period, and determines, during clearing the high level, whether the counting value of the high levels of the clock signal being checked during the current high level period exceeds the first expected value and whether the counting value of the rising edges exceeds the second expected value.

The determiner 403 determines the clock signal being checked as valid when determining that all the counting value of the high levels of the clock signal being checked during high level periods A, B and C do not exceed the first expected value and all the counting values of the rising edges do not exceed the second expected value (as shown in FIG. 8, a clock-lost signal can be set to 0 at this time); and the programmable device determines the clock signal being checked as invalid when determining that all the counting values of the high levels of the clock signal being checked during high level periods A, B and C exceed the first expected value and all the counting values of the rising edges of the clock signal being checked during high level periods A, B and C exceed the second expected value (as shown in FIG. 8, the clock-lost signal can be set to 1).

In addition, the programmable device can also determine the duty ratio of the clock signal being checked as: dividing the counting value of the high levels of the clock signal being checked which is 12500 during the high level period A by ½ of the ratio of the frequency of the source clock signal 50 MHz to the frequency of the reference clock signal 100 KHz, i.e., the duty ratio of the clock signal being checked is 12500/ [(50*10e6/1*10e3)½]. It should be explained that the counting value of the high levels used to calculate the duty ratio can be a counting value of the high levels of the clock signal being checked during any high level period out of the N continuous high levels.

The above contents are the preferable embodiments of the present invention, and it should be noted that to those skilled in the art, variations and modifications can be made without departing from the principle described in the present invention, and these variations and modifications are considered to be comprised in the protection scope of the present invention.

What is claimed is:

1. A method for clock checking, comprising:
a programmable device performing frequency division on a source clock signal generated by a local timing source, to obtain a reference clock signal;
the programmable device treating the source clock signal as a counting work clock, and determining counting value of rising edges and counting value of high levels of a clock signal being checked, during each high level period out of N continuous high levels of the reference clock signal, wherein the N is a positive integer; and
the programmable device determining whether the clock signal being checked is valid according to the magnitude relationship between the counting value of the high levels of the clock signal being checked during the each high level period and a first expected value, as well as the magnitude relationship between the counting value of the rising edges of the clock signal being checked during the each high level period and a second expected value.

2. The method according to claim 1, wherein, the step of the programmable device determining whether the clock signal being checked is valid according to the magnitude relationship between the counting value of the high levels of the clock signal being checked during the each high level period and a first expected value, as well as the magnitude relationship between the counting value of the rising edges of the clock signal being checked during the each high level period and a second expected value comprises:

the programmable device determining whether the counting value of the high levels of the clock signal being checked during the each high level period exceeds the first expected value and whether the counting value of the rising edges of the clock signal being checked during the each high level period exceeds the second expected value; and the programmable device determining that the clock signal being checked is valid when the programmable device determines that the counting value of the high levels of the clock signal being checked during the each high level period does not exceed the first expected value and the counting value of the rising edges does not exceed the second expected value; and the programmable device determining that the clock signal being checked is invalid when the programmable apparatus determines that the counting value of the high levels of the clock signal being checked during the each high level period exceeds the first expected value and the counting value of the rising edges exceeds the second expected value.

3. The method according to claim 2, wherein, the step of the programmable apparatus determining whether the counting value of the high levels of the clock signal being checked during the each high level period exceeds the first expected value and whether the counting value of the rising edges exceeds the second expected value comprises:

the programmable device latching, at a falling edge of the each high level, the counting value of the high levels and the counting value of the rising edges of the clock signal being checked during a current high level period, then clearing the counting value of the high levels and the counting value of the rising edges of the clock signal being checked during the current high level period, and determining, during clearing the high level, whether the counting value of the high levels of the clock signal being checked during the current high level period exceeds the first expected value and whether the counting value of the rising edges of the clock signal being checked during the current high level period exceeds the second expected value.

4. The method according to claim 3, wherein the method further comprises:

the programmable device determining duty ratio of the clock signal being checked as: dividing the counting value of the high levels of the clock signal being checked during any high level period out of the N continuous high levels by ½ of the ratio of a frequency of the source clock signal to a frequency of the reference clock signal.

5. The method according to claim 2, wherein the method further comprises:

the programmable device determining duty ratio of the clock signal being checked as: dividing the counting value of the high levels of the clock signal being checked during any high level period out of the N continuous high levels by ½ of the ratio of a frequency of the source clock signal to a frequency of the reference clock signal.

6. The method according to claim 1, wherein the method further comprises:

the programmable device determining duty ratio of the clock signal being checked as: dividing the counting value of the high levels of the clock signal being checked during any high level period out of the N continuous high levels by ½ of the ratio of a frequency of the source clock signal to a frequency of the reference clock signal.

7. An apparatus for clock checking, comprising:
a local timing source configured to generate a source clock signal; and a programmable device configured to perform frequency division on the source clock signal to obtain a reference clock signal, to treat the source clock signal as a counting work clock so as to determine a counting value of rising edges and a counting value of high levels of a clock signal being checked during each high level period out of N continuous high levels of the reference clock signal, wherein the N is a positive integer, and to determine whether the clock signal being checked is valid according to a magnitude relationship between the counting value of the high levels of the clock signal being checked during the each high level period and a first expected value as well as a magnitude relationship between the counting value of the rising edges of the clock signal being checked during the each high level period and a second expected value.

8. The apparatus according to claim 7, wherein the programmable device comprises:

a frequency divider configured to perform frequency division on the source clock signal to obtain the reference clock signal;

a counter configured to treat the source clock signal as the counting work clock, to obtain the counting value of the rising edges by counting rising edges of the clock signal being checked during the each high level period of the reference clock signal, and to obtain the counting value of the high levels by sampling and counting high levels of the clock signal being checked during the each high level period; and a determiner configured to determine whether the clock signal being checked is valid according to the magnitude relationship between the counting value of the high levels of the clock signal being checked during the each high level period and the first expected value as well as the magnitude relationship between the counting value of the rising edges and the second expected value.

9. The apparatus according to claim 8, wherein the determiner comprises:

a judging module configured to determine whether the counting value of the high levels of the clock signal being checked during the each high level period exceeds the first expected value, and whether the counting value of the rising edges exceeds the second expected value; and a determining module configured to determine the clock signal being checked as valid when the counting value of the high levels of the clock signal being checked during the each high level period does not exceed the first expected value and the counting value of the rising edges of the clock signal being checked during the each high level period does not exceed the second expected value; and to determine the clock signal being checked as invalid when the counting value of the high levels of the clock signal being checked during the each high level period exceeds the first expected value and the counting value of the rising edges of the clock signal being checked during the each high level period exceeds the second expected value.

10. The apparatus according to claim 9, wherein,
the judging module is configured to latch, at a falling edge of the each high level, the counting value of the high levels and the counting value of the rising edges of the clock signal being checked during a current high level period, then to clear the counting value of the high levels and the counting value of the rising edges of the clock signal being checked during the current high level period, and to determine, during clearing the high level, whether the counting value of the high levels of the clock signal being checked during the current high level period exceeds the first expected value and whether the counting value of the rising edges of the clock signal being checked during the current high level period exceeds the second expected value.

11. The apparatus according to claim 10, wherein the apparatus further comprises:
a duty ratio determining module configured to determine duty ratio of the clock signal being checked as: dividing the counting value of the high levels of the clock signal being checked during any high level period out of the N continuous high levels by ½ of ratio of a frequency of the source clock signal to a frequency.

12. The apparatus according to claim 9, wherein the apparatus further comprises:
a duty ratio determining module configured to determine duty ratio of the clock signal being checked as: dividing the counting value of the high levels of the clock signal being checked during any high level period out of the N continuous high levels by ½ of ratio of a frequency of the source clock signal to a frequency of the reference clock signal.

13. The apparatus according to claim 8, wherein the apparatus further comprises:
a duty ratio determining module configured to determine duty ratio of the clock signal being checked as: dividing the counting value of the high levels of the clock signal being checked during any high level period out of the N continuous high levels by ½ of ratio of a frequency of the source clock signal to a frequency of the reference clock signal.

14. The apparatus according to claim 7, wherein the apparatus further comprises:
a duty ratio determining module configured to determine duty ratio of the clock signal being checked as: dividing the counting value of the high levels of the clock signal being checked during any high level period out of the N continuous high levels by ½ of ratio of a frequency of the source clock signal to a frequency of the reference clock signal.

* * * * *